United States Patent
Varghese et al.

(10) Patent No.: US 7,435,651 B2
(45) Date of Patent: Oct. 14, 2008

(54) METHOD TO OBTAIN UNIFORM NITROGEN PROFILE IN GATE DIELECTRICS

(75) Inventors: Ajith Varghese, McKinney, TX (US); Reima T. Laaksonen, Dallas, TX (US); Terrence J. Riley, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 370 days.

(21) Appl. No.: 11/224,219

(22) Filed: Sep. 12, 2005

(65) Prior Publication Data
US 2007/0054455 A1    Mar. 8, 2007

(51) Int. Cl.
*H01L 21/8234* (2006.01)

(52) U.S. Cl. .................. 438/275; 438/287; 438/981; 257/E21.625

(58) Field of Classification Search .......... 438/275, 438/287, 775, 776, 981; 257/E21.192, E21.302, 257/E21.625
See application file for complete search history.

(56) References Cited

U.S. PATENT DOCUMENTS

| 6,730,566 | B2 | 5/2004 | Niimi et al. |
| 6,773,999 | B2* | 8/2004 | Yoneda ................. 438/287 |
| 7,227,201 | B2* | 6/2007 | Varghese et al. ........... 257/204 |
| 2004/0070046 | A1* | 4/2004 | Niimi .................. 257/510 |
| 2004/0102010 | A1* | 5/2004 | Khamankar et al. ....... 438/287 |

* cited by examiner

*Primary Examiner*—Chandra Chaudhari
(74) *Attorney, Agent, or Firm*—Wade J. Brady, III; Frederick J. Telecky, Jr.

(57) ABSTRACT

The present invention, in one aspect, provides a method of manufacturing a microelectronics device 100 that includes depositing a first gate dielectric layer 160 over a substrate 115, subjecting the first gate dielectric layer 160 to a first nitridation process, forming a second gate dielectric layer 165 over the substrate 115 and having a thickness less than a thickness of the first gate dielectric layer 160, and subjecting the first and second gate dielectric layers 160,165 to a second nitridation process, wherein the first and second nitridation processes are different. The present invention also provides a microelectronics device 100 fabricated in accordance with the method.

18 Claims, 5 Drawing Sheets

METHOD TO OBTAIN UNIFORM NITROGEN PROFILE IN GATE DIELECTRICS

TECHNICAL FIELD OF THE INVENTION

The present invention is directed in general to a method for manufacturing a microelectronics device, and more specifically, to a method of achieving a uniform nitrogen profile in a gate dielectric having a thickness of 2 nm or greater.

BACKGROUND

High performance integrated circuits have gained wide acceptance and utility in present day electronic devices that utilize high data applications. In addition, however, there is a great demand for shrinking these microelectronic devices to provide an increased device density on the microelectronic chip and provide chips that are faster, but at the same time, consume less power to conserve and extend battery life. In fact, to provide the required device performance, the scaling of the gate dielectric thickness in these devices has now reached below 2.0 nm in the core or low voltage regions, while the dielectric thickness in the input/output (I/O) regions is 2.0 nm or greater.

However, simply scaling standard dielectrics while maintaining good process control in this thickness regime is very difficult. Thus, the industry is left with the desire to use thicker films that are correspondingly easier to control to tight limits, while decreasing the electrical dielectric thickness to increase device performance (increase drive current or $I_{DS}$) with less leakage and without degradation to long channel threshold voltages.

To achieve these goals, the industry has turned to the use of higher dielectric constant materials. One such material that has found popular utility is nitrogen, which may be incorporated using a de-coupled plasma nitridation process or DPN process. In such processes, plasma nitridation is used to incorporate a dielectric with a uniformly high dose of nitrogen. The addition of this nitrogen effectively increases the dielectric constant value of the gate dielectric, thus allowing a physically thicker film to be electrically thinner. In other words, a smaller equivalent oxide thickness (EOT) is achieved. The presence of the nitrogen in the gate oxide also blocks boron penetration, which prevents the boron from getting into the channel region and which could further affect device performance.

This conventional nitridation process works well in achieving a fairly uniform nitrogen profile in the low voltage or core regions of the device where the gate dielectric thickness is below 2 nm. Uniform nitrogen profile across the thickness of the dielectric is highly desirable from a reliability perspective. A non-uniform nitrogen depth profile causes spatially non-uniform trap generation and thereby higher number of time dependent dielectric breakdowns (TDDB) or lower mean time to failure. However, in the I/O regions where the dielectric thickness is at 2 nm or greater, the nitrogen profile is not uniform in that the nitrogen can pile up at the upper surface of the gate dielectric, which results in a non-uniform nitrogen profile. A non-uniform nitrogen profile in the I/O region creates serious reliability issues with the operation of the microelectronic devices in that it may cause premature breakdown of the gate dielectric.

As the microelectronics industry continues to improve its process technologies, controlling or reducing the amount of leakage associated with these transistors in both the core region and the I/O region becomes increasingly difficult. Further, the amount of leakage associated with a transistor during its use has experienced a growing concern within the microelectronics industry. Concern over this issue has increased as the desire to extend the battery life used in electronic communication devices has also become of greater importance.

Thus, while the increase of the nitrogen in the gate oxide allows smaller EOTs to be achieved and is substantially uniform in the core region of the device, the non-uniformity of the nitrogen profile in the I/O region and the dielectric reliability issues associated therewith is a growing problem as expectations of device performance continues to increase.

Accordingly, what is needed in the art is a nitridation process that overcomes the deficiencies discussed above.

SUMMARY OF INVENTION

To overcome the deficiencies in the prior art, the present invention, in one embodiment, provides a method of fabricating a microelectronics device. This embodiment comprises forming a first gate dielectric layer over a substrate, subjecting the first gate dielectric layer to a first nitridation process, forming a second gate dielectric layer over the substrate and that has a thickness less than a thickness of the first gate dielectric layer, and subjecting the first and second gate dielectric layers to a second nitridation process, wherein the first and second nitridation processes are different.

In another embodiment, there is provided a method of fabricating a dual gate integrated circuit. This particular embodiment comprises forming a first gate dielectric layer over a substrate, subjecting the first gate dielectric layer to a first nitridation process, removing a portion of the first gate dielectric layer to form a core region and an input/output region, forming a second gate dielectric layer over the substrate in the core region wherein the second gate dielectric layer has a thickness less than a thickness of the first gate dielectric layer, and subjecting the first and second gate dielectric layers to a second nitridation process, wherein the first and second nitridation processes are different. The method further comprises forming dual transistor gates over the first and second dielectric layers in the core region and input/output region, creating source/drain regions within wells located in the substrate, depositing dielectric layers over the transistors, and forming interconnects within the dielectric layers to interconnect the transistors to form an operative integrated circuit.

In yet another embodiment there is provided a microelectronics device that comprises a first transistor having a first gate dielectric layer that is located in an input/out region of the microelectronics device. The first dielectric layer has a thickness of about 2 nm or greater and further has a substantially flat nitrogen profile throughout a substantial portion of the thickness of the first gate dielectric layer. The device further includes a second transistor that has a second gate dielectric layer and that is located in a core region of the microelectronics device. The second gate dielectric layer has a thickness that is less than the thickness of the first gate dielectric layer and is less than about 2 nm.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
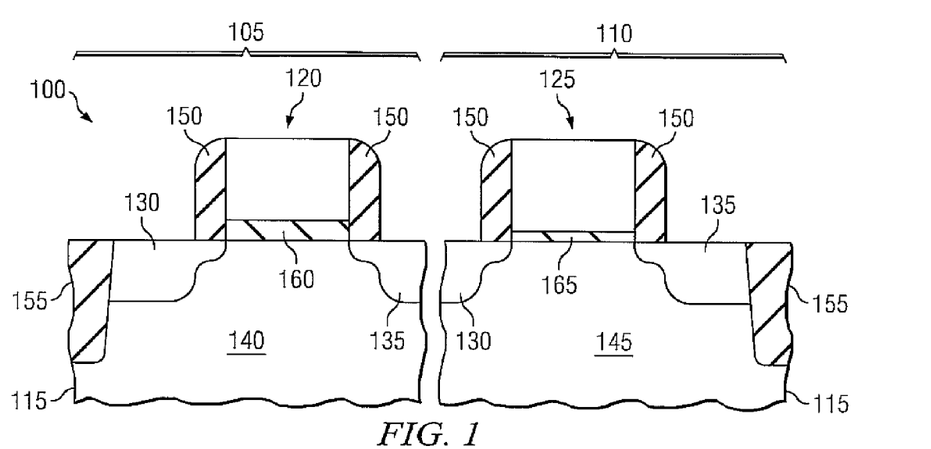
FIG. 1 illustrates a partial, break-away, sectional view of one embodiment of a microelectronics device, as provided by the present invention.

Turning initially to FIG. 1, there is illustrated a partial, sectional break-away view of one embodiment of a microelectronics device 100, as provided by the present invention. The exemplary embodiment shown in FIG. 1 is a dual gate transistor device that includes an input/output (I/O) region 105 and a core region 110 that are located over a microelectronics substrate 115. The I/O region 105 typically operates at a higher voltage than does the core region 110. For example, the operating voltage of the I/O region may range from about 1.8 volts to about 3.3 volts, while the operating voltage of the core region may range from about 1.1 volts to about 1.3 volts. It should be understood by those skilled in the art, however, that these voltages are exemplary only and that the operating voltage of both the I/O region 105 and the core region 110 will vary, depending on design.

The microelectronics device 100 also includes a transistor 120 located in the I/O region 105 and a transistor 125 located in the core region 110. Each of these transistors will further include conventionally doped source/drains 130, 135 that are formed in conventionally doped wells 140, 145. The respective transistors 120, 125 also include oxide spacers 150 and trench isolation structures 155 that electrically isolate the transistors 120, 125 from adjacent transistors. All of these aspects of transistors 120, 125, as just discussed, may be formed using conventional processes and materials.

The transistors 120 and 125 further include gate dielectric layers 160 and 165, respectively. As seen in FIG. 1, the gate dielectric layer 160 that is associated with the transistor 120 in the I/O region 105 is thicker than the gate dielectric layer 165 that is associated with the transistor 125 in the core region 110. The reason for the different thickness is due to their disparate operating voltages. For example, the gate dielectric layer 160 will have a thickness of about 2 nm or greater. In one advantageous embodiment, the gate dielectric layer 160 will have a thickness ranging from about 2 nm to about 2.5 nm. The thickness of the gate dielectric layer 165, on the other hand, will have a thickness that is less than about 2 nm, and in a more specific embodiment, the thickness will range from about 0.8 nm to about 1.5 nm.

As explained below in more detail, both of these gate dielectric layers 160 and 165 contain a percent nitrogen concentration that forms a nitrogen profile though a substantial portion of the thickness of the each of the gate dielectric layers 160 and 165. However, unlike the gate dielectric layers formed by conventional processes, the gate dielectric layers 160 and 165 do not suffer from the disadvantages associated with those conventionally formed gate dielectric layers.

For example, in conventional devices, the nitrogen in the gate dielectric layers located in an I/O region of a microelectronics device would have a pile-up of nitrogen near the upper surface, and its nitrogen profile would not be substantially flat through a substantial portion of the thickness of the gate dielectric layer. This is highly undesirable because it decreases transistor reliability. The pile-up of nitrogen is attributable to the use of conventional nitridation processes that are currently being used when the thicker I/O gate is nitrided.

For instance, in conventional processes, the I/O gate dielectric layer is nitrided with a plasma process. While such processes produce uniform nitrogen profiles in thinner oxides (e.g. those less than 2 nm), they do not produce a substantially uniform, or flat, nitrogen profile in the thicker gate dielectric layers (e.g. those of 2 nm or greater).

In contrast to conventional processes, however, the present invention recognizes the benefits associated with conducting a different nitridation process on the thicker gate dielectric layers located in the I/O regions of the microelectronics device and following this with a plasma nitridation process that further nitridates the thicker gate dielectric layers, while also nitriding the thinner gate dielectric layers located in the core region. Using these different nitridation processes results in substantially uniform or flat nitrogen profiles in both the I/O gate dielectric and the core region dielectric, which results in a more reliable microelectronics device.

Figure 2A:
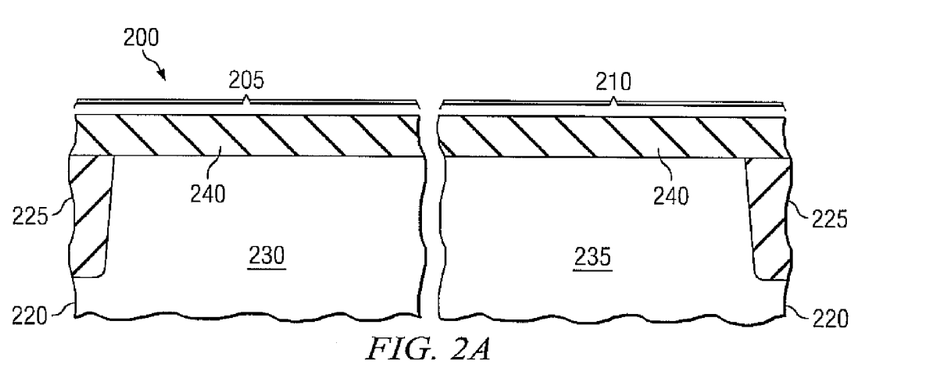
FIG. 2A illustrates a partial sectional, break-away view of an exemplary microelectronics device, at an early stage of manufacture and as discussed with respect to FIG. 1.

Referring now to FIG. 2A, there is shown a partial sectional, break-away view of an exemplary microelectronics device 200, at an early stage of manufacture and as discussed with respect to FIG. 1. Like the device in FIG. 1, the microelectronics device 200 shown in FIG. 2A is also a dual gate device that has an I/O region 205 and a core region 210. At this stage of manufacture, the microelectronics device 200 includes a substrate 220, such as a semiconductor material comprising silicon, gallium or germanium or it may be comprised of any other type of semiconductive material known to those who are skilled in the art. The device 200 also includes conventionally formed isolation structures 225 and conventionally formed and doped wells 230, 235.

Formed over the substrate 220 is gate dielectric layer 240. In this view, the gate dielectric layer 240 is formed over the substrate 220 in both the I/O region 205 and the core region 210. The gate dielectric layer 240 can be formed by conventional processes, such as by thermal oxidation growth processes. The gate dielectric layer 240 will serve as the gate dielectric for the high voltage transistors located in the I/O region. As such, it has the thickness as mentioned above, (e.g. 2 nm or greater). At this point in the fabrication process, the gate dielectric layer 240 is not nitrided.

Figure 2B:
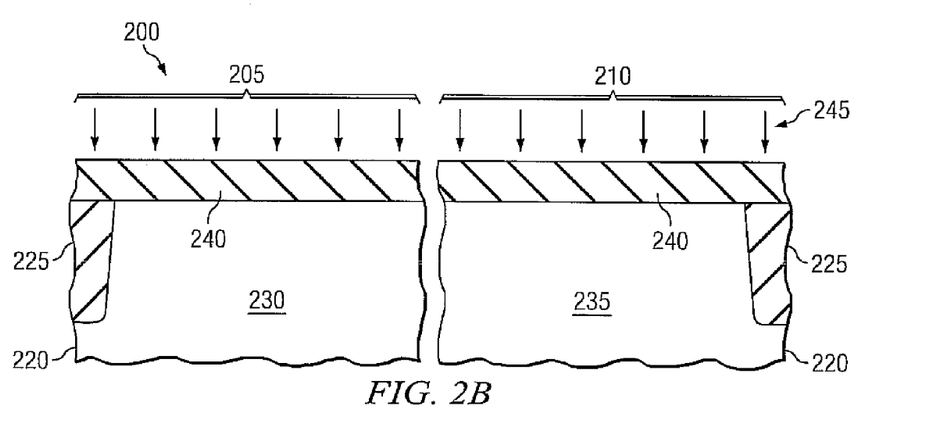
FIG. 2B illustrates a gate dielectric of the microelectronics device of FIG. 2A undergoing a first nitridation process, as provided by the present invention.

Turning now to FIG. 2B, there is illustrated the microelectronics device of FIG. 2A undergoing a nitridation process 245 as provided by the present invention. In an exemplary embodiment, the nitridation process is a non-plasma nitridation process and is conducted in the presence of nitrogen at high temperatures. In one embodiment, the nitrogen has a flow rate ranging from about 2 to about 5 slm and at a temperature that is ramped up to a temperature ranging from about 700 degrees centigrade to about 950 degrees centigrade. The pressure within the furnace preferably ranges from about 30 torr to about 80 torr, and the time during which the nitrogen is flowed may range from about 2 minutes to about 30 minutes. The nitrogen may be supplied by ammonia ($NH_3$), nitrous oxide ($N_2O$), or nitric oxide (NO). Following the main nitrogen flow, the nitrided gate dielectric 240 is subjected to a re-oxidation step in which nitrogen ($N_2$) gas and oxygen ($O_2$) are flowed over the microelectronics device 200 at a temperature of about 850 degrees centigrade. The flow of the nitrogen gas is conducted at about 9 slm and the oxygen flow is conducted at about 1 slm. An nitrogen anneal, where the flow of nitrogen is continued from the previous step at 9 slm, is preferably conducted following the re-oxidation step. During the anneal, the temperature is ramped up to a temperature of about 1000 degrees centigrade to repair any damage caused during the nitrogen's incorporation into the gate dielectric 240. In an advantageous embodiment, the above nitridation process is a furnace nitridation process. However, the process may be conducted in other tools. Alternatively, non-plasma nitrided oxides can also be done in a single wafer reactor or in a mini batch furnace.

Unlike, the conventional processes discussed above, an exemplary embodiment of the nitridation process 245, as provided by the present invention, incorporates a substantial portion of nitrogen near an interface between the gate dielectric layer 240 and the substrate 220, as opposed to piling the nitrogen near the upper surface of the gate dielectric layer 240. When followed by the second nitridation process as described below, a more uniform and flat nitrogen profile can be achieved.

Figure 2C:
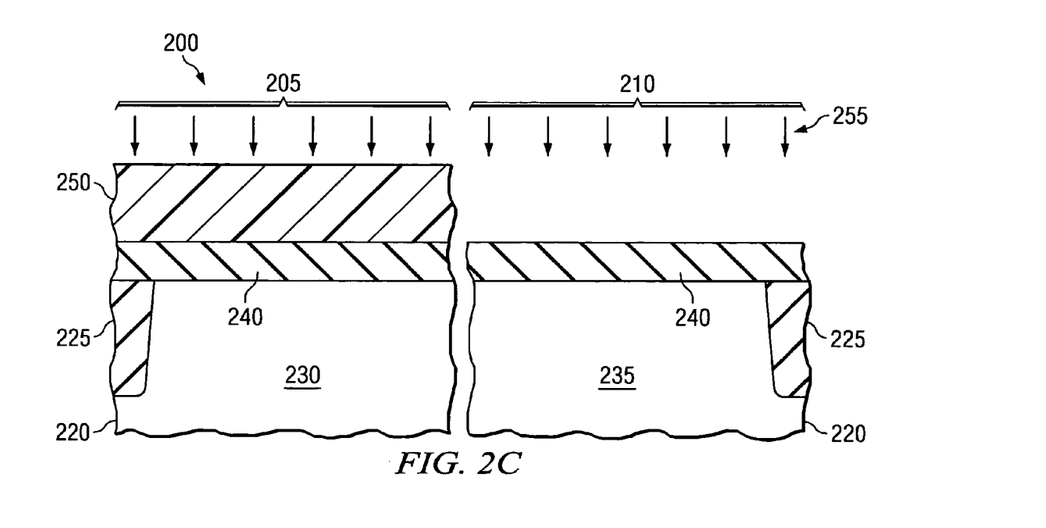
FIG. 2C illustrates the microelectronics device of FIG. 2B after the patterning of a conventional lithographic mask.

As shown in FIG. 2C, after the nitridation of the gate dielectric layer 240, the gate dielectric layer 240 is patterned with a conventional masking material 250, such as a photoresist, such that the gate dielectric layer 240 in the I/O region 205 is protected from subsequent fabrication processes, and the gate dielectric layer 240 overlying the core region 210 is exposed to those processes. Once the microelectronics device 200 is patterned, a conventional gate dielectric etch 255 is conducted to remove the gate dielectric layer 240 that overlies the core region 210. The gate dielectric etch 255 is conducted until the exposed portion of the gate dielectric layer 240 is removed, thereby leaving the surface of the substrate 220 exposed, as shown in FIG. 3A.

Figure 3A:
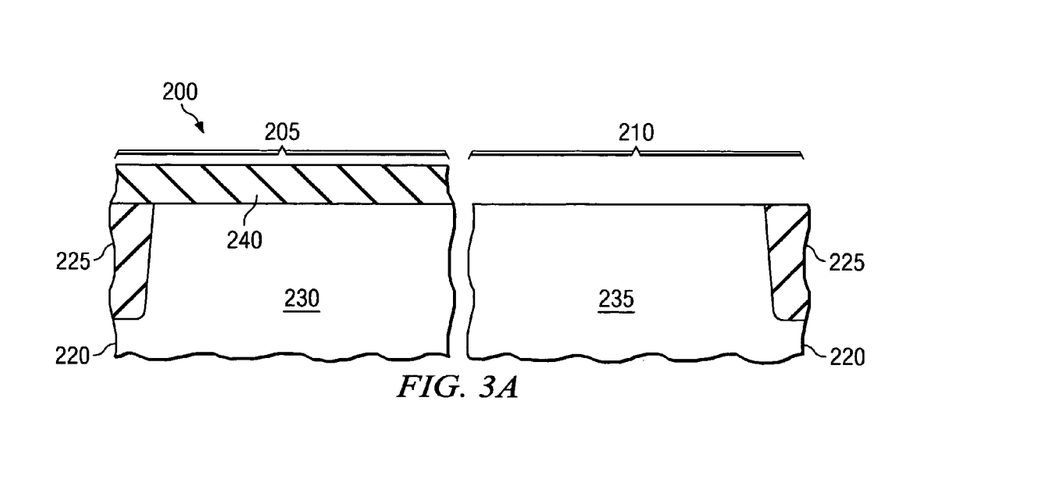
FIG. 3A illustrates partial, sectional, break-away view of the microelectronics device of FIG. 2C following a gate dielectric etch.

Referring briefly to FIG. 3A, there is illustrated a partial, sectional, break-away view of the microelectronics device 200 of FIG. 2C following the gate dielectric etch 255. Once the gate dielectric etch 255 is completed, the masking material 250 is conventionally removed, for example by a wet chemical process, which results in the microelectronics device 200 shown in FIG. 3A.

Figure 3B:
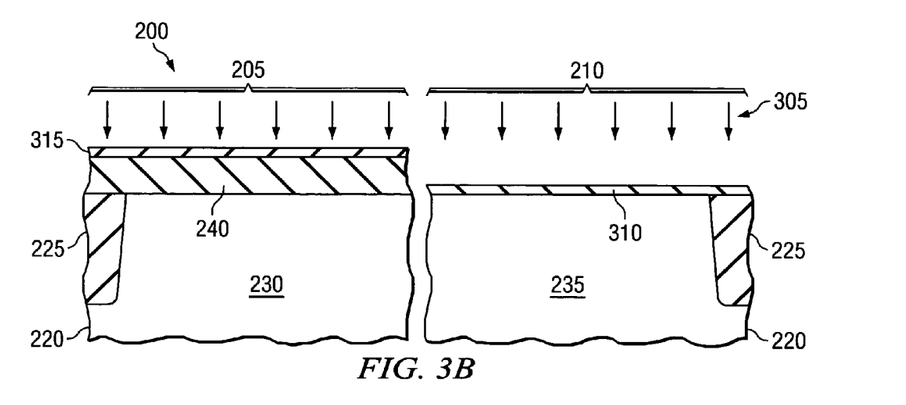
FIG. 3B illustrates a partial, sectional, break-away view of the microelectronics device of FIG. 3A following the removal of the gate dielectric layer overlying the core region of the microelectronics device.

Turning now to FIG. 3B, the microelectronics device 200 of FIG. 3A is illustrated. At this point of fabrication, the microelectronics device 200 has undergone a conventional oxidation growth process 305 that forms a thin gate dielectric layer 310 in the core region 210 and adds an additional thickness 315 to the gate dielectric layer 240 located in the I/O region 205. Preferably, the conventional oxidation growth process is conducted in the presence of oxygen and at high temperature of around 800 to 1000 degrees centigrade.

Figure 3C:
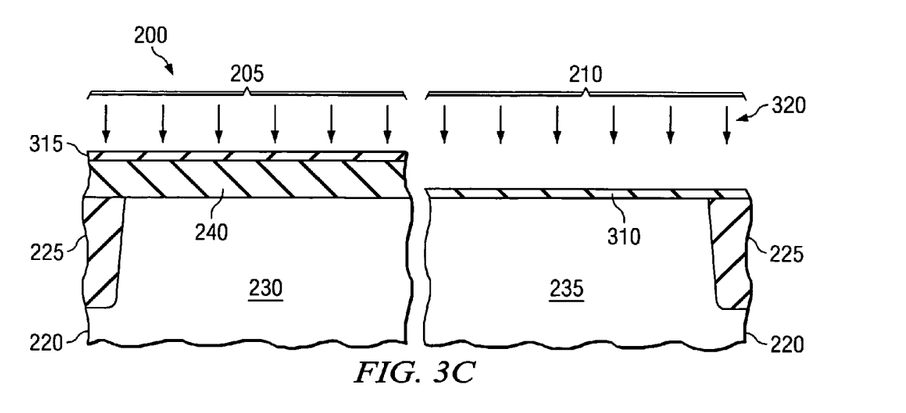
FIG. 3C illustrate a partial, sectional, break-away view of the microelectronics device of FIG. 3B, following the formation of the second gate dielectric layer.

Referring now to FIG. 3C, there is illustrated a sectional, break-away view of the microelectronics device 200 of FIG. 3B, following the formation of the gate dielectric layers 310 and 315. At this point in the fabrication process, the microelectronics device 200 is subjected to a second nitridation process 320. In an advantageous embodiment, nitridation process 320 is a conventional plasma nitridation process, such as a DPN process. In one aspect, the nitridation process 320 comprises conducting the nitridation in the presence of nitrogen having a flow rate ranging from about 50 sccms to about 500 sccms. The radio frequency power preferably ranges from about 300 watts to about 1000 watts, and more preferably at a power ranging from about 300 watts to about 800 watts. The pressure during plasma nitridation preferably ranges from about 15 mTorr to about 25 mTorr, and the nitridation process may be conducted for a period of time ranging from about 30 seconds to about 60 seconds. In other embodiments, the nitrogen may be flowed with a carrier gas, such as helium. In such embodiments, the flow rate ratio of the nitrogen to the helium is 1:1. For example, if the flow rate of nitrogen is 50 sccms, then the flow of helium would also be 50 sccms. Following the completion of the nitridation process 320, conventional fabrication processes are conducted to arrive at the microelectronics device 100, as illustrated in FIG. 1.

Figure 4A:
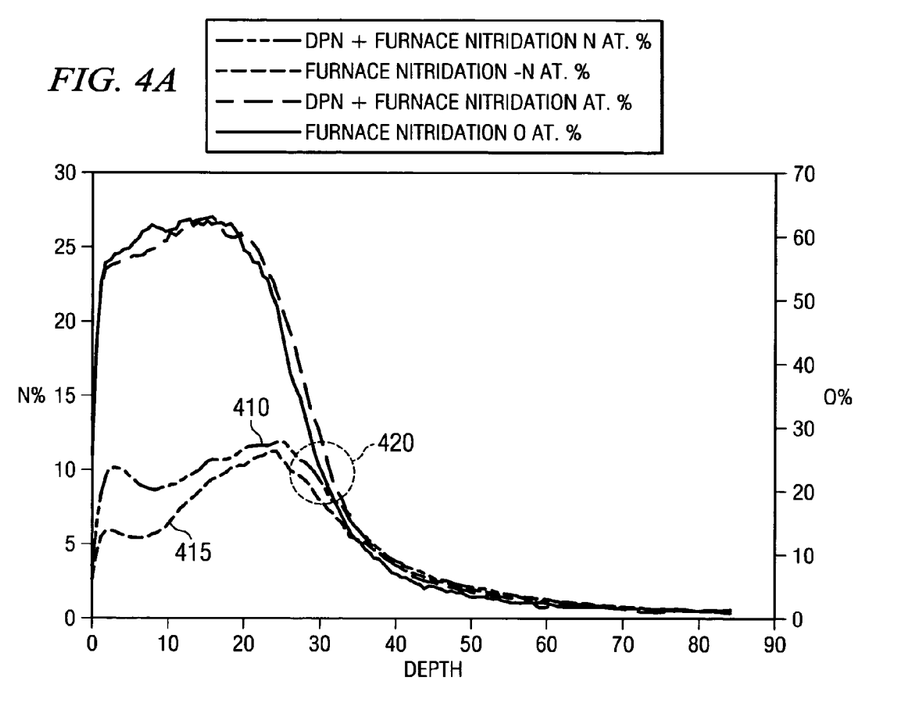
FIG. 4A illustrates graph of percent nitrogen concentration versus thickness of the I/O region gate dielectric, as shown in FIG. 1.

Turning now to FIG. 4A there are illustrated a graph of percent nitrogen concentration versus thickness of gate dielectric 160 (FIG. 1). FIG. 4A illustrates the resulting nitrogen profile of the gate dielectric overlying the I/O region 105 (FIG. 1) after the nitridation process discussed above with respect to FIG. 2A and the nitridation process discussed above with respect to FIG. 3C, as provided by those embodiments. As seen from this graph, the resulting nitrogen profile, as provided by the present invention and designated by line 410, is where the nitrogen profile uniformity is about 50% or less. In an exemplary embodiment, the profile uniformity is about 40% or less. As used herein, profile uniformity is equal to a maximum percent nitrogen (Max (N) in the gate dielectric minus a minimum percent nitrogen (Min (N) in the gate dielectric, the difference of which is divided by the average percent nitrogen in the gate dielectric, or (Max (N))−(Min (N))/Average N.

The nitrogen profile is substantially uniform throughout most of the thickness of the gate dielectric when neglecting the fringe affects occurring within the first few nanometers from the upper surface and the last few nanometers near the gate dielectric layer/substrate interface, as illustrated in FIG. 4A. For example, in an advantageous embodiment, the percent nitrogen is determined between the first 0.3 nm in from the dielectric surface and to about 0.3 nm in from the dielectric/substrate interface (i.e., the dielectric thickness or oxygen 50% fall depth). This is in contrast to the nitrogen profile, designated by line 415, as provided by a conventional process, where the nitrogen profile uniformity is about 75%. As seen from FIG. 4A, line 410 shows the improved and more uniform nitrogen profile across the substantial thickness of the gate dielectric, while the nitrogen profile, line 415 clearly depicts the pile up of nitrogen near the gate dielectric/substrate interface 420.

Figure 4B:
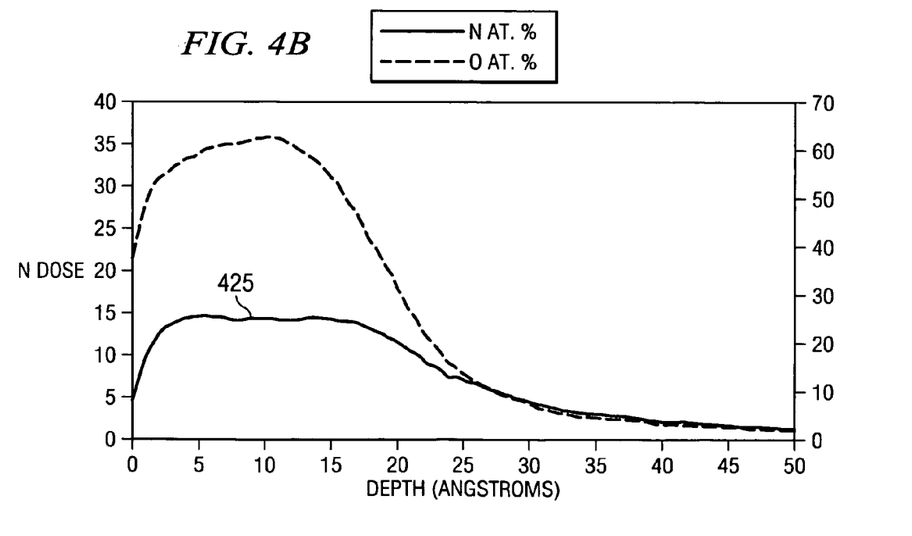
FIG. 4B illustrates graph of percent nitrogen concentration versus thickness of the core region gate dielectric, as shown in FIG. 1.

Turning now to FIG. 4B there is illustrated a graph of percent nitrogen concentration versus thickness of gate dielectric 165 (FIG. 1). FIG. 4B illustrates the resulting nitrogen profile, designated by line 425, of the gate dielectric overlying the core region 110 (FIG. 1) after the nitridation process discussed above with respect to FIG. 3C. As seen from this graph, the resulting nitrogen profile is substantially flat such that the nitrogen profile uniformity is less than about 7 percent throughout a substantial portion of the thickness of the gate dielectric layer 165 (FIG. 1). That is, the nitrogen profile is substantially uniform throughout most of the thickness of the gate dielectric when neglecting the fringe affects occurring within the first few nanometers from the upper surface and the last few nanometers near the gate dielectric layer/substrate interface, as illustrated in FIG. 4B, and as discussed above.

From the foregoing, it can be seen that the present invention provides a substantially flat nitrogen profile for not only the gate dielectric located in the core region, but it also uniquely provides a substantially flat nitrogen profile for the thicker gate dielectric within the I/O region, which has not been previously provided by conventional nitridation processes. As such, overall device reliability is increased in both the I/O region and the core region.

Figure 5:
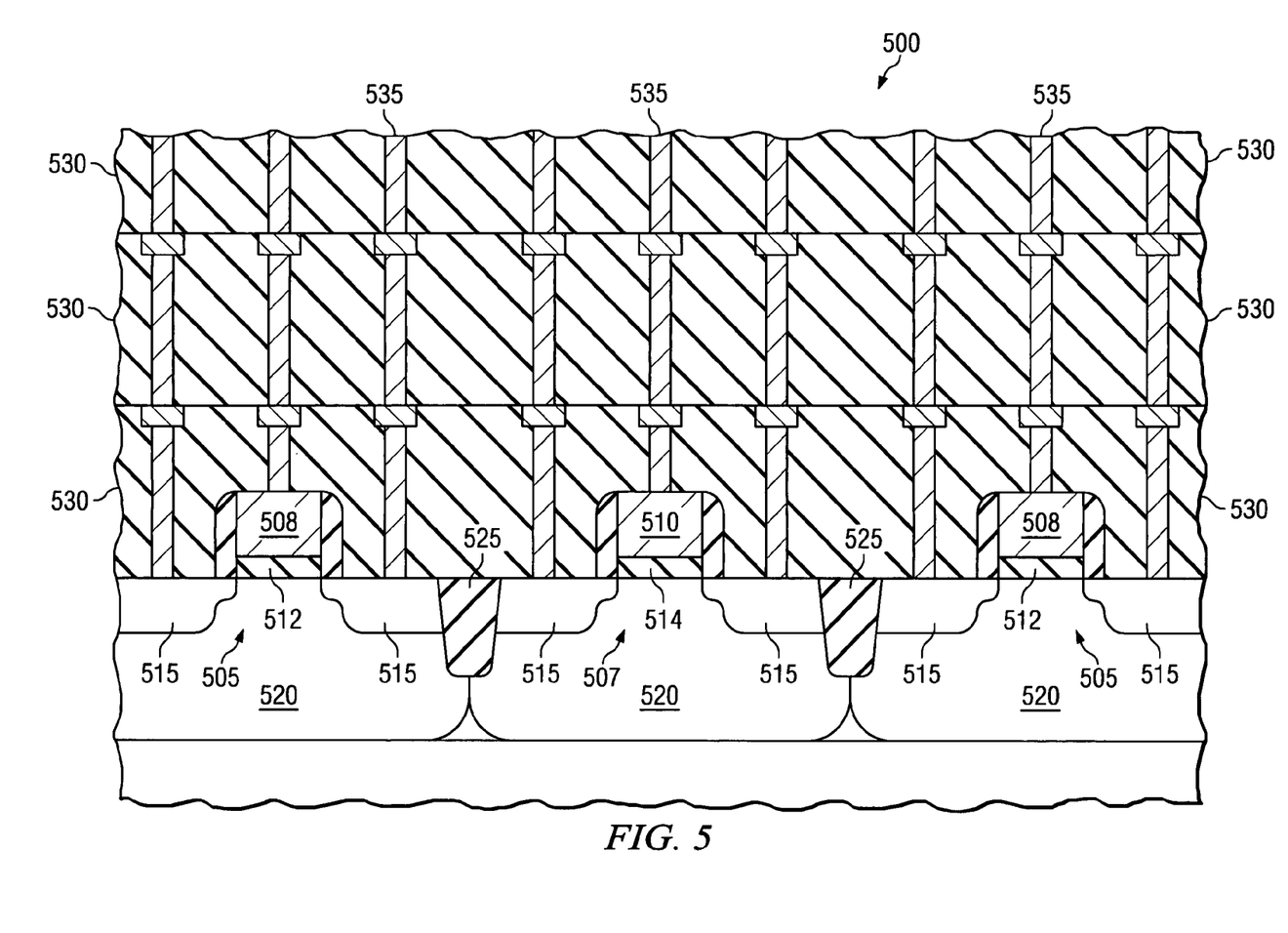
FIG. 5 illustrates a partial, sectional view of a dual voltage, integrated circuit device that can be fabricated in accordance with the principles of the present invention.

FIG. 5 represents a partial sectional view of a dual voltage, integrated circuit device 500 that can be fabricated in accordance with the principles of the present invention. The integrated circuit 500 includes low voltage transistors 505 and high voltage transistor 507, and each respectively includes a low voltage gate 508 and a high voltage gate 510. The gates 508 and 510 are designed to operate at their respective designed operating voltages. The low voltage gates 508 are electrically isolated by a nitridated, low voltage gate dielectric 512, and the high voltage gate 510 is electrically isolated by a nitridated, high voltage gate dielectric 514, both of which may be fabricated in accordance with the principles of the present invention.

The transistors 505 and 507 also each includes conventional source/drains 515 formed in wells 520, which can be doped as design requires. Conventional isolation structures 525 separate and electrically isolate the transistors 505 and 507 from each other. Interlevel dielectric layers 530 are located over the transistors 505 and 507 and interconnects 535 are formed therein to interconnect the various transistors 505 and 507 to form an operative integrated circuit. Given the teachings of present application, one who is skilled in the art would know how to form the operative integrated circuit as shown in FIG. 5.

Although the present invention has been described in detail, one who is of ordinary skill in the art should understand that they can make various changes, substitutions, and alterations herein without departing from the scope of the invention.

What is claimed is:

1. A method of fabricating a microelectronics device, comprising:
    forming a first gate dielectric layer over a substrate;
    subjecting the first gate dielectric layer to a first nitridation process;
    after subjecting the first gate dielectric to the first nitridation process, forming a second gate dielectric layer over the substrate and having a thickness less than a thickness of the first gate dielectric layer and which adds to the thickness of the first gate dielectric layer; and
    subjecting the first and second gate dielectric layers to a second nitridation process, wherein the first and second nitridation processes are different.

2. The method as recited in claim 1, wherein the first gate dielectric layer is located in an input/out region of the substrate and has a thickness of about 2 nm or greater.

3. The method as recited in claim 2, further including removing the first gate dielectric layer that is located over a core region of the substrate and wherein the second gate dielectric layer is located in the core region and has a thickness that is less than about 2 nm.

4. The method as recited in claim 1, wherein the first nitridation process is a nitridation process that places a substantial portion of nitrogen near an interface between the first gate dielectric layer and the substrate.

5. The method as recited in claim 4, wherein the nitridation process is a furnace nitridation process that is conducted in the presence of nitrogen having a flow rate ranging from about 2 to about 5 slm, at a temperature ranging from about 700 degrees centigrade to about 950 degrees centigrade, at a pressure ranging from about 30 torr to about 80 torr and for a period of time ranging from about 2 minutes to about 30 minutes.

6. The method as recited in claim 5, wherein the nitrogen is in the form of ammonia ($NH_3$), nitrous oxide ($N_2O$), or nitric oxide (NO).

7. The method as recited in claim 1 wherein the second nitridation process is a plasma nitridation process.

8. The method as recited in claim 7, wherein the plasma nitridation is conducted in the presence of nitrogen having a flow rate ranging from about 50 sccrns to about 500 sccms, at a radio frequency power ranging from about 300 watts to about 1000 watts, at a pressure ranging from about 15 mTorr to about 25 mTorr and for a period of time ranging from about 30 seconds to about 60 seconds.

9. The method as recited in claim 8, wherein the plasma nitridation is further conducted in the presence of helium and the flow rate ratio of the nitrogen to the helium is 1:1.

10. The method as recited in claim 1, wherein the first and second nitridation processes forms a substantially uniform nitrogen profile in the first gate dielectric layer in the input/output region such that a nitrogen profile uniformity is less than about 50% throughout a substantial portion of the thickness of the first gate dielectric layer in the input/output region.

11. A method of fabricating a dual gate integrated circuit, comprising:
    forming a first gate dielectric layer over a substrate;
    subjecting the first gate dielectric layer to a first nitridation process;
    removing a portion of the first gate dielectric layer to form a core region and an input/output region;
    forming a second gate dielectric layer over the substrate in the core region, the second gate dielectric layer having a thickness less than a thickness of the first gate dielectric layer; and
    subjecting the first and second gate dielectric layers to a second nitridation process, wherein the first and second nitridation processes are different;
    forming dual transistor gates over the first and second dielectric layers in the core region and input/output region;

creating source/drain regions within wells located in the substrate;

depositing dielectric layers over the transistors; and forming interconnects within the dielectric layers to interconnect the transistors to form an operative integrated circuit, wherein a nitrogen profile uniformity of the gate dielectric layer in the input/output region is less than about 50% throughout a substantial thickness of the gate dielectric layer in the input/output region.

12. The method as recited in claim 11, wherein the first gate dielectric layer is located in an input/out region of the substrate and has a thickness of about 2 nm or greater.

13. The method as recited in claim 11, wherein the second gate dielectric layer has a thickness of less than about 2 nm.

14. The method as recited in claim 11, wherein the nitridation process is a furnace nitridation process that is conducted in the presence of nitrogen having a flow rate ranging from about 2 to about 5 slm, at a temperature ranging from about 700 degrees centigrade to about 950 degrees centigrade, at a pressure ranging from about 30 torr to about 80 torr and for a period of time ranging from about 2 minutes to about 30 minutes.

15. The method as recited in claim 14, wherein the nitrogen is in the form of ammonia ($NH_3$), nitrous oxide ($N_2O$), or nitric oxide (NO).

16. The method as recited in claim 11 wherein the second nitridation process is a plasma nitridation process.

17. The method as recited in claim 16, wherein the plasma nitridation is conducted in the presence of nitrogen having a flow rate ranging from about 50 sccms to about 500 sccms, at a radio frequency power ranging from about 300 watts to about 1000 watts, at a pressure ranging from about 15 mTorr to about 25 mTorr and for a period of time ranging from about 30 seconds to about 60 seconds.

18. The method as recited in claim 17, wherein the plasma nitridation is further conducted in the presence of helium and the flow rate ratio of the nitrogen to the helium is 1:1.

* * * * *